(12) United States Patent
Chang et al.

(10) Patent No.: US 9,887,186 B2
(45) Date of Patent: Feb. 6, 2018

(54) MEMORY CIRCUIT, LAYOUT OF MEMORY CIRCUIT, AND METHOD OF FORMING LAYOUT

(71) Applicant: TAIWAN SEMICONDUCTOR MANUFACTURING COMPANY, LTD., Hsinchu (TW)

(72) Inventors: Jacklyn Chang, San Ramon, CA (US); Kuoyuan (Peter) Hsu, San Jose, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 14/610,158

(22) Filed: Jan. 30, 2015

(65) Prior Publication Data
US 2016/0225753 A1 Aug. 4, 2016

(51) Int. Cl.
*H01L 27/02* (2006.01)
*H01L 27/088* (2006.01)
*H01L 23/522* (2006.01)
*H01L 23/528* (2006.01)
*H01L 27/105* (2006.01)
*G06F 17/50* (2006.01)
*H01L 27/112* (2006.01)

(52) U.S. Cl.
CPC ...... *H01L 27/0207* (2013.01); *G06F 17/5072* (2013.01); *H01L 23/528* (2013.01); *H01L 23/5226* (2013.01); *H01L 27/11226* (2013.01)

(58) Field of Classification Search
CPC .......................... H01L 27/0207; G06F 17/5072
USPC .......................................... 257/401; 716/119
See application file for complete search history.

(56) References Cited

U.S. PATENT DOCUMENTS

| | | | |
|---|---|---|---|
| 8,421,205 B2 | 4/2013 | Yang | |
| 8,661,389 B2 | 2/2014 | Chern et al. | |
| 8,698,205 B2 | 4/2014 | Tzeng et al. | |
| 8,826,212 B2 | 9/2014 | Yeh et al. | |
| 8,836,141 B2 | 9/2014 | Chi et al. | |
| 2008/0316798 A1* | 12/2008 | Tanizaki | G11C 11/56 365/148 |
| 2014/0215420 A1 | 7/2014 | Lin et al. | |
| 2014/0264924 A1 | 9/2014 | Yu et al. | |
| 2014/0282289 A1 | 9/2014 | Hsu et al. | |
| 2014/0325466 A1 | 10/2014 | Ke et al. | |

* cited by examiner

*Primary Examiner* — Cuong Q Nguyen
*Assistant Examiner* — Tong-Ho Kim
(74) *Attorney, Agent, or Firm* — Hauptman Ham, LLP

(57) ABSTRACT

A memory circuit includes a first active structure extending along a first direction, a second active structure extending along the first direction, a first conductive structure extending along a second direction, and a lowest via plug layer over the first conductive structure. The first active structure has a shared source portion corresponding to a source node of a first memory cell of the memory circuit and a source node of a second memory cell of the memory circuit. The second active structure has a shared source portion corresponding to a source node of a third memory cell of the memory circuit and a source node of a fourth memory cell of the memory circuit. The first conductive structure electrically connects the shared source portion of the first active structure with the shared source portion of the second active structure.

20 Claims, 10 Drawing Sheets

US 9,887,186 B2

1

MEMORY CIRCUIT, LAYOUT OF MEMORY CIRCUIT, AND METHOD OF FORMING LAYOUT

BACKGROUND

The semiconductor integrated circuit (IC) industry has experienced rapid growth. Technological advances in IC materials and design have produced generations of ICs where each generation has smaller and more complex circuits than the previous generation. In the course of integrated circuit evolution, functional density (i.e., the number of interconnected devices per chip area) has generally increased while geometry size (i.e., the smallest component or line that can be created using a fabrication process) has decreased. When the width of a conductive line becomes smaller, the unit-length resistance of the conductive line becomes greater. Also, when the number of memory cells in a memory circuit increases, the lengths and corresponding resistance of data lines (such as bit lines) and control lines (such as word lines) of the memory circuit increases. In many applications, an operating speed of a memory circuit is determinable based on the resistance of bit lines and/or word lines thereof.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
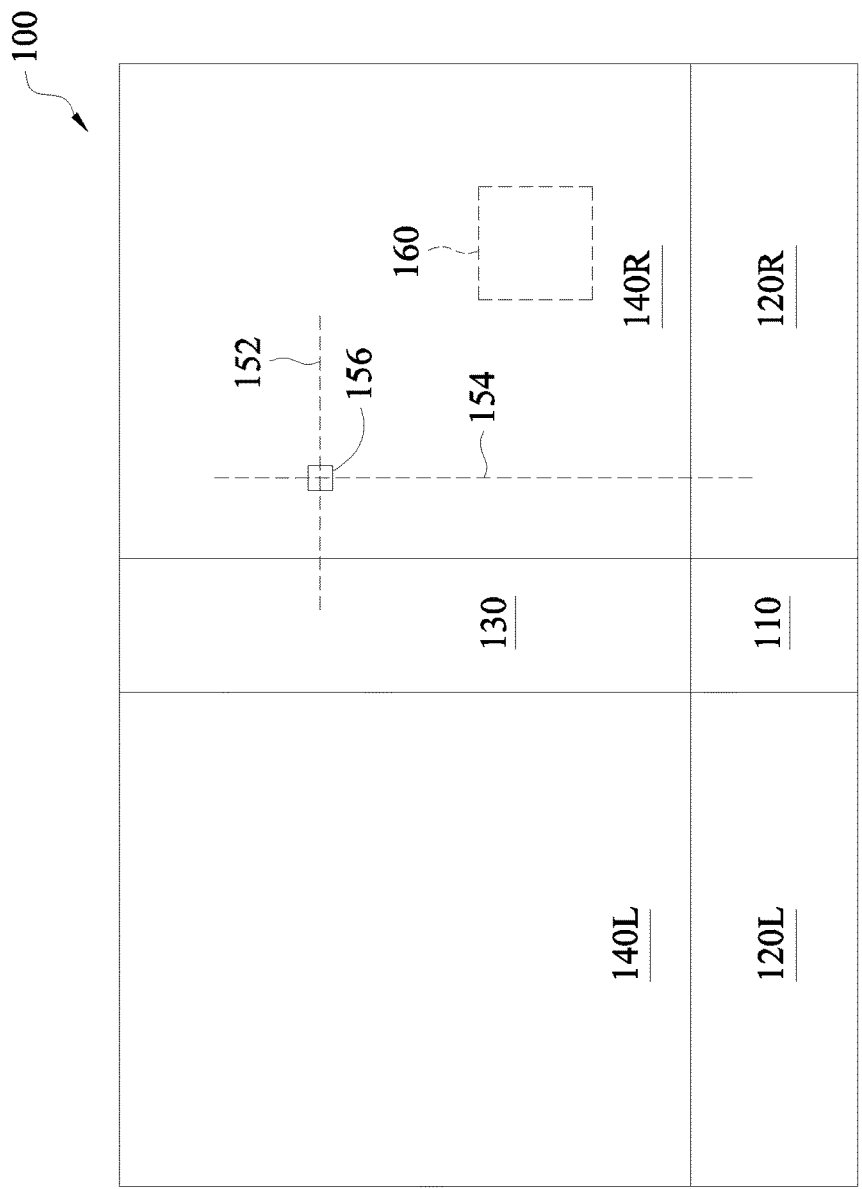
FIG. 1 is a functional block diagram of a memory circuit in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments of the present application, a layout design of a memory circuit is based on a unit layout design corresponding to two-by-two memory cells. The unit layout design includes two bit lines and one shared reference voltage line in a conductive layer below the lowest via plug layer of the memory circuit. As such, the cell height for a unit layout design corresponding to two-by-two memory cells is reduced, and a length of word lines of the unit layout design is reduced in comparison with a configuration that has two bit lines and two reference voltage lines.

Furthermore, in some applications using multiple patterning technology, a group of four conductive lines (having three line pitches) occupies an area that is 150% or greater than an area occupied by a group of three conductive lines (having two line pitches). In such application, the unit layout design includes three conductive lines (e.g., two bit lines and one shared reference voltage line) avoids using a group of four conductive lines in a unit layout design.

FIG. 1 is a functional block diagram of a memory circuit 100 in accordance with some embodiments. Memory circuit 100 is a read-only memory (ROM) including a global controller 110, global input/output (GIO) circuits 120L and 120R, a word line decoder 130, and memory cell arrays 140L and 140R. In operation, global controller 110 activates a word line (e.g., word line 152) via word line decoder 130 and activate a sensing circuit in GIO circuits 120L and 120R corresponding to a selected bit line (e.g., bit line 154) in order to read a stored datum from a selected memory cell (e.g., memory cell 156) of memory cell arrays 140L and 140R.

In some embodiments, memory cell arrays 140L and 140R are fabricated according to a layout design formed by tiling a plurality of unit layout cells. In the embodiment depicted in FIG. 1, a unit layout cell corresponds to a group of four memory cells 160, where the memory cells thereof are arranged into two columns and two rows. In some embodiments, the unit layout cell corresponding to the group of four memory cells 160 is also referred to as a two-by-two unit layout cell.

Figure 2:
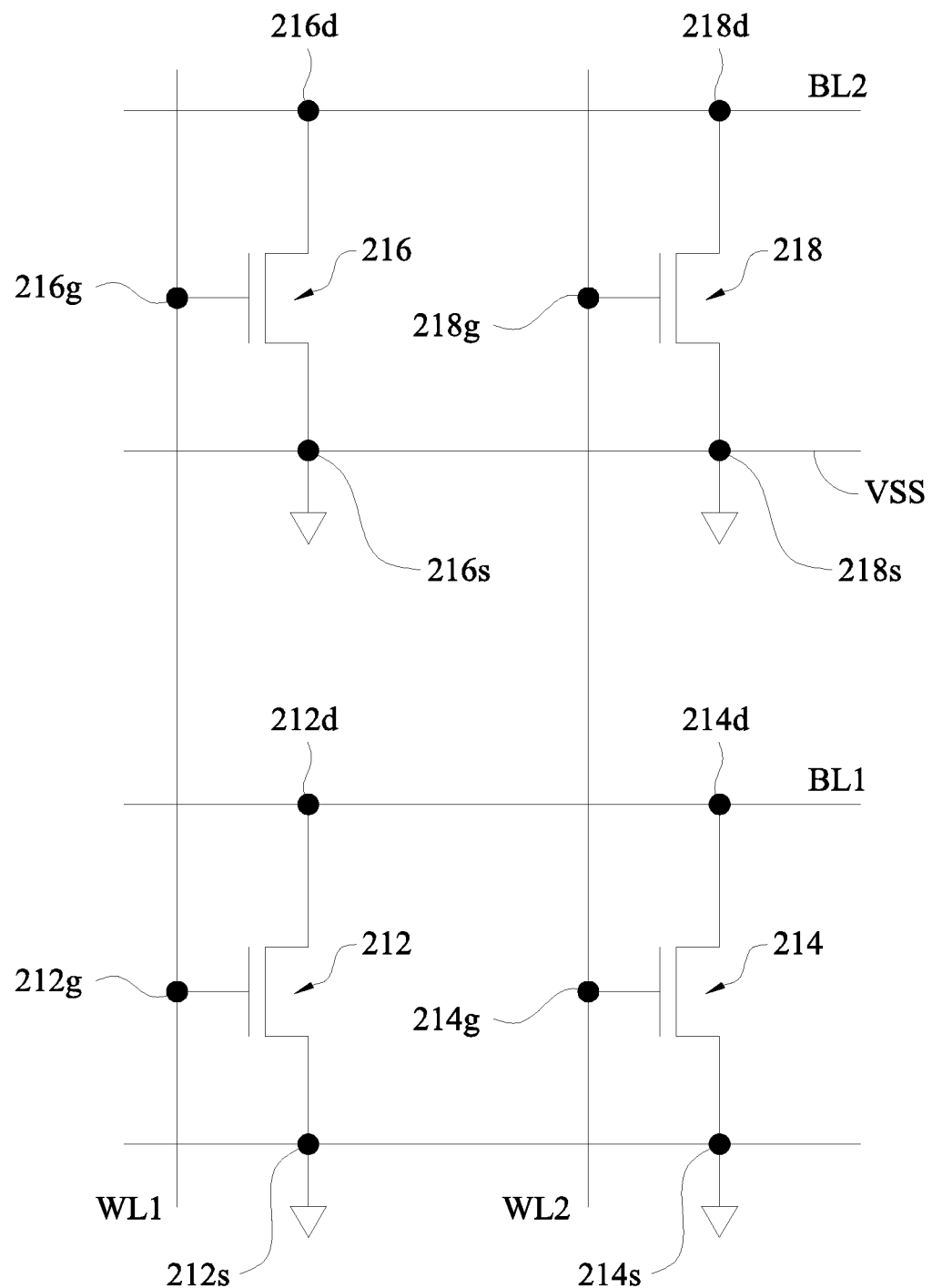
FIG. 2 is a schematic diagram of a group of four memory cells in accordance with some embodiments.

FIG. 2 is a schematic diagram of a group of four memory cells 200 in accordance with some embodiments. In some embodiments, the group of four memory cells 200 corresponds to the group of four memory cells 160 depicted in FIG. 1.

The group of four memory cells 200 includes four memory cells 212, 214, 216, and 218 coupled with word lines WL1 and WL2, bit lines BL1 and BL2, and a reference voltage line VSS. In the embodiment depicted in FIG. 2, memory cells 212, 214, 216, and 218 are N-type transistors having corresponding gate nodes 212g, 214g, 216g, and 218g; corresponding source nodes 212s, 214s, 216s, and 218s; and corresponding drain nodes 212d, 214d, 216d, and 218d. Gate nodes 212g and 216g are electrically coupled with word line WL1. Gate nodes 214g and 218g are electrically coupled with word line WL2. Source nodes 212s, 214s, 216s, and 218s are electrically coupled with reference voltage line VSS. Drain nodes 212d and 214d are electrically coupled with bit line BL1. Drain nodes 216d and 218d are electrically coupled with bit line BL2.

In some embodiments, one or both of drain nodes 212d and 214d are not electrically coupled with bit line BL1. In some embodiments, one or both of drain nodes 216d and 218d are not electrically coupled with bit line BL2. Whether the drain node 212d, 214d, 216d, or 218d is electrically coupled with the corresponding bit line BL1 or BL2 depends on a programming state of the memory cell 212, 214, 216, or 218. For example, if memory cell 212 is set to a programmed state, drain node 212d is not electrically coupled with bit line BL1. On the other hand, if memory cell 212 is set to a non-programmed state, drain node 212d is electrically coupled with bit line BL1.

In the embodiment depicted in FIG. 2, memory cells 212, 214, 216, and 218 are N-type transistors. In some embodiments, memory cells 212, 214, 216, and 218 are P-type transistors.

Figure 3:
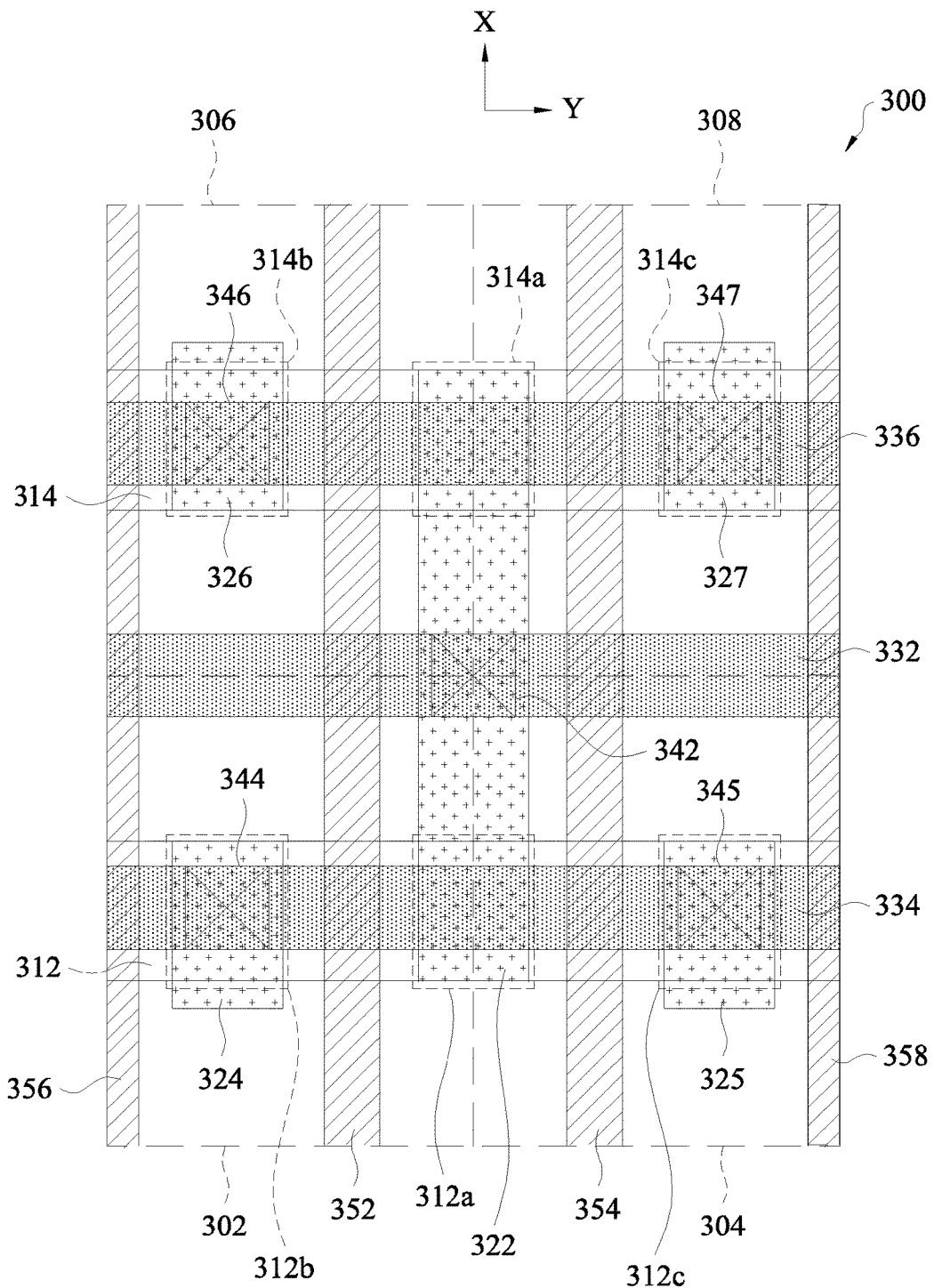
FIG. 3 is a layout diagram of a portion of a layout design of the four memory cells in FIG. 2 in accordance with some embodiments.

FIG. 3 is a layout diagram of a portion of a layout design 300 of the four memory cells in FIG. 2 in accordance with some embodiments. Layout design 300 includes a first memory cell region 302 corresponding to memory cell 212 in FIG. 2, a second memory cell region 304 corresponding to memory cell 214, a third memory cell region 306 corresponding to memory cell 216, and a fourth memory cell region 308 corresponding to memory cell 218.

The first, second, third, and fourth memory cell regions 302-308 are arranged to abut one another in a two-by-two manner. First and second memory cell regions 302 and 304 are placed side by side along a column direction Y. Third and fourth memory cell regions 306 and 308 are placed side by side along the column direction Y. First and third memory cell regions 302 and 306 are placed side by side along a row direction X. Second and fourth memory cell regions 304 and 308 are placed side by side along the row direction X.

Layout design 300 also includes oxide diffusion (OD) layout patterns 312 and 314, conductive layout patterns 322, 324, 325, 326, and 327 of a conductive layout layer, conductive layout patterns 332, 334, and 336 of another conductive layout layer, via layout patterns 342, 344, 345, 346, and 347, and gate layout patterns 352, 354, 356, and 358.

OD layout pattern 312 corresponds to an active structure (e.g., 412 in FIG. 4) for forming memory cells 212 and 214. OD layout pattern 312 extends along the column direction Y and overlaps the first memory cell region 302 and the second memory cell region 304. OD layout pattern 312 includes a shared source portion 312a and drain portions 312b and 312c. The shared source portion 312a overlaps the first memory cell region 302 and the second memory cell region 304. Shared source portion 312a corresponds to source nodes 212s and 214s of memory cells 212 and 214. Drain portion 312b corresponds to drain node 212d of memory cell 212. Drain portion 312c corresponds to the drain node 214d of memory cell 214.

OD layout pattern 314 corresponds to another active structure (e.g., 414 in FIG. 4) for forming memory cells 216 and 218. OD layout pattern 314 extends along the column direction Y and overlaps the third memory cell region 306 and the fourth memory cell region 308. OD layout pattern 314 includes a shared source portion 314a and drain portions 314b and 314c. The shared source portion 314a overlaps the third memory cell region 306 and the fourth memory cell region 308. Shared source portion 314a corresponds to source nodes 216s and 218s of memory cells 216 and 218. Drain portion 314b corresponds to drain node 216d of memory cell 216. Drain portion 314c corresponds to the drain node 218d of memory cell 218.

Figure 4:
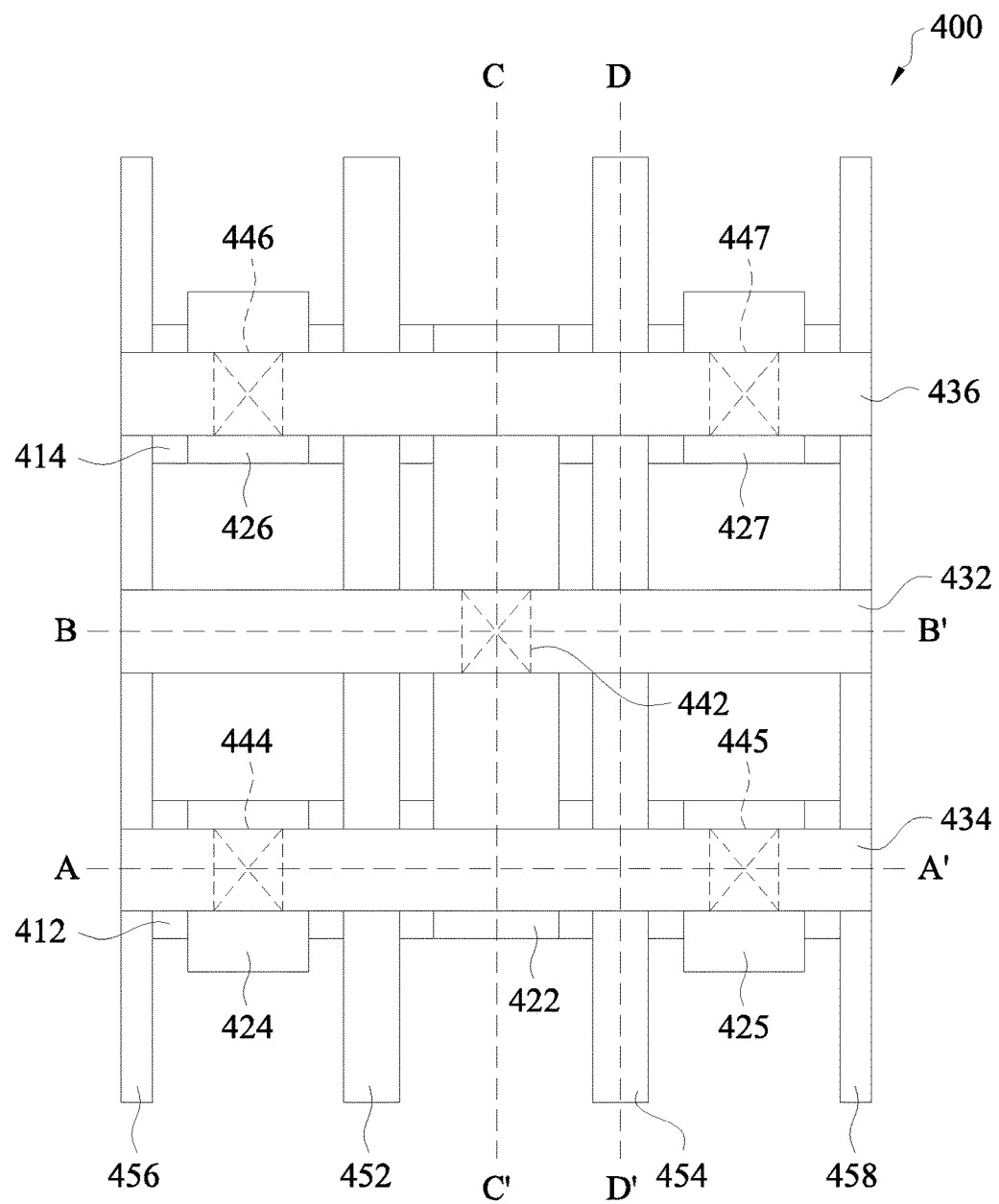
FIG. 4 is a top view of a portion of a memory circuit fabricated based on the layout diagram of FIG. 3 in accordance with some embodiments.

Conductive layout pattern 322 corresponds to a conductive structure (e.g., 422 in FIG. 4). The conductive structure 422 is under a lowest via plug layer of the memory circuit. In some embodiments, conductive structure 422 is at a conductive layer that is referred to as a metal-0 (M0) layer, a metal-0 over OD (M0OD) layer, a sub-layer of the M0OD layer. Conductive layout pattern 322 extends along the row direction X and overlaps the shared source portions 312a and 314a. The conductive structure formed based on conductive layout pattern 322 electrically connects the portions of active structures corresponding to the shared source portions 312a and 314a.

Conductive layout patterns 324 and 325 correspond to conductive structures (e.g., 424 and 425 in FIG. 4) that are at the same conductive layer as the conductive structure formed based on conductive layout pattern 322. Conductive layout pattern 324 overlaps the drain portion 312b, and conductive layout pattern 325 overlaps the drain portion 312c. The conductive structure formed based on conductive layout pattern 324 is electrically coupled with the portion of active structure corresponding to the drain portion 312b, and the conductive structure formed based on conductive layout pattern 325 is electrically coupled with the portion of active structure corresponding to the drain portion 312c.

Conductive layout patterns 326 and 327 correspond to conductive structures (e.g., 426 and 427 in FIG. 4) that are at the same conductive layer as the conductive structure formed based on conductive layout pattern 322. Conductive layout pattern 326 overlaps the drain portion 314b, and conductive layout pattern 327 overlaps the drain portion 314c. The conductive structure formed based on conductive layout pattern 326 is electrically coupled with the portion of active structure corresponding to the drain portion 314b, and the conductive structure formed based on conductive layout pattern 327 is electrically coupled with the portion of active structure corresponding to the drain portion 314c.

Conductive layout pattern 332 corresponds to a conductive structure (e.g., 432 in FIG. 4). The conductive structure 432 is above the lowest via plug layer of the memory circuit. In some embodiments, conductive structure 432 is at a conductive layer that is referred to as a metal-1 (M1) layer. Conductive layout pattern 332 extends along the column direction Y and overlaps the conductive layout pattern 322. The conductive structure formed based on conductive layout pattern 332 is electrically coupled with the conductive structure formed based on conductive layout pattern 322. In some embodiments, conductive layout pattern 332 corresponds to forming a reference voltage line VSS in FIG. 2.

Conductive layout pattern 334 correspond to conductive structures (e.g., 434 in FIG. 4) that are at the same conductive layer as the conductive structure formed based on conductive layout pattern 332. Conductive layout pattern 334 extends along the column direction Y and overlaps the OD layout pattern 312. The conductive structure formed based on conductive layout pattern 334 is electrically coupled with none, or one, or both of the portions of active structure corresponding to the drain portions 312b and 312c according to the logical value to be stored in memory cells 212 and 214. In some embodiments, conductive layout pattern 334 corresponds to forming a bit line BL1 in FIG. 2.

Conductive layout pattern 336 corresponds to conductive structures (e.g., 436 in FIG. 4) that are at the same conductive layer as the conductive structure formed based on conductive layout pattern 332. Conductive layout pattern 336 extends along the column direction Y and overlaps the OD layout pattern 314. The conductive structure formed based on conductive layout pattern 336 is electrically coupled with none, or one, or both of the portions of active structure corresponding to the drain portions 314a and 314c according to the logical value to be stored in memory cells 216 and 218. In some embodiments, conductive layout pattern 336 corresponds to forming a bit line BL2 in FIG. 2.

Figure 6:
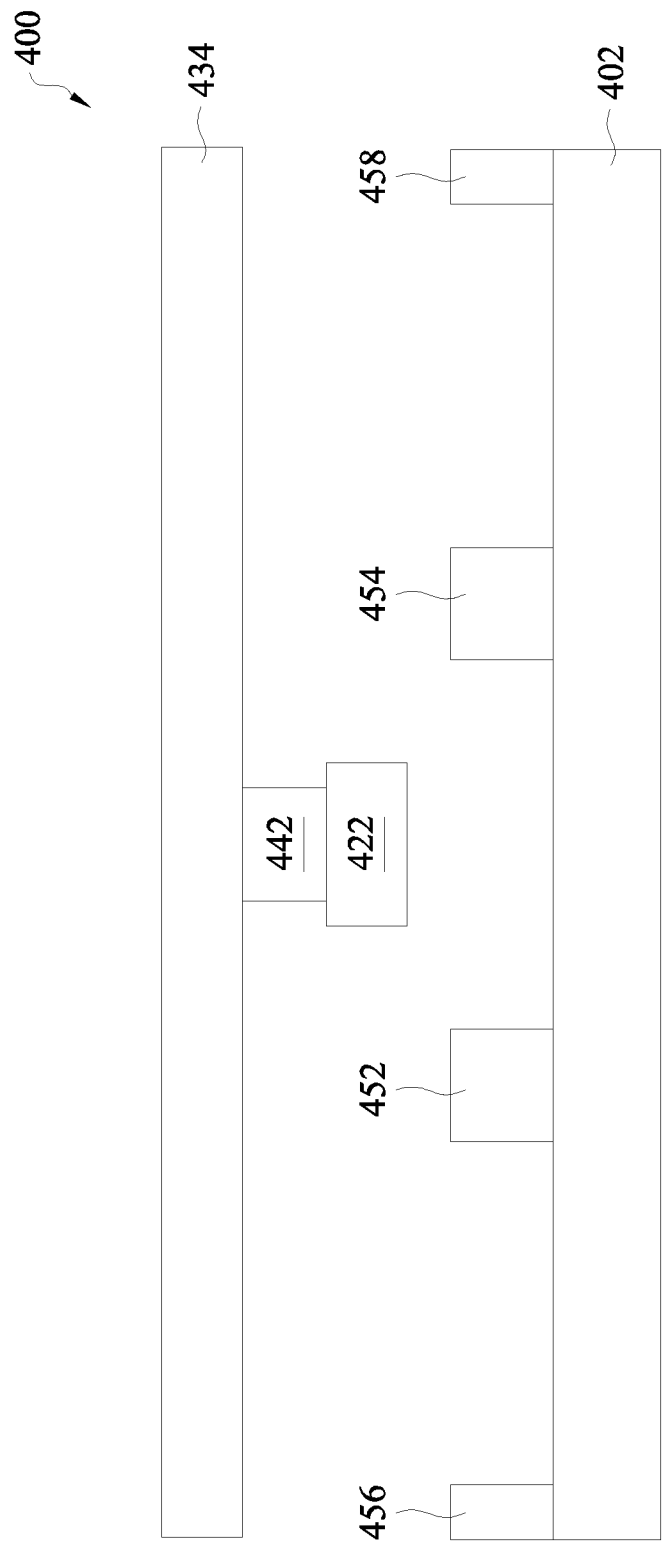

Via layout pattern 342 corresponds to a via plug (e.g., via plug 442 in FIGS. 4 and 6). The via plug 442 is at the lowest via plug layer of the memory circuit. The via plug formed based on via layout pattern 342 is between and electrically connecting the conductive structures formed based on conductive layout pattern 322 and conductive layout pattern 332.

Figure 5:
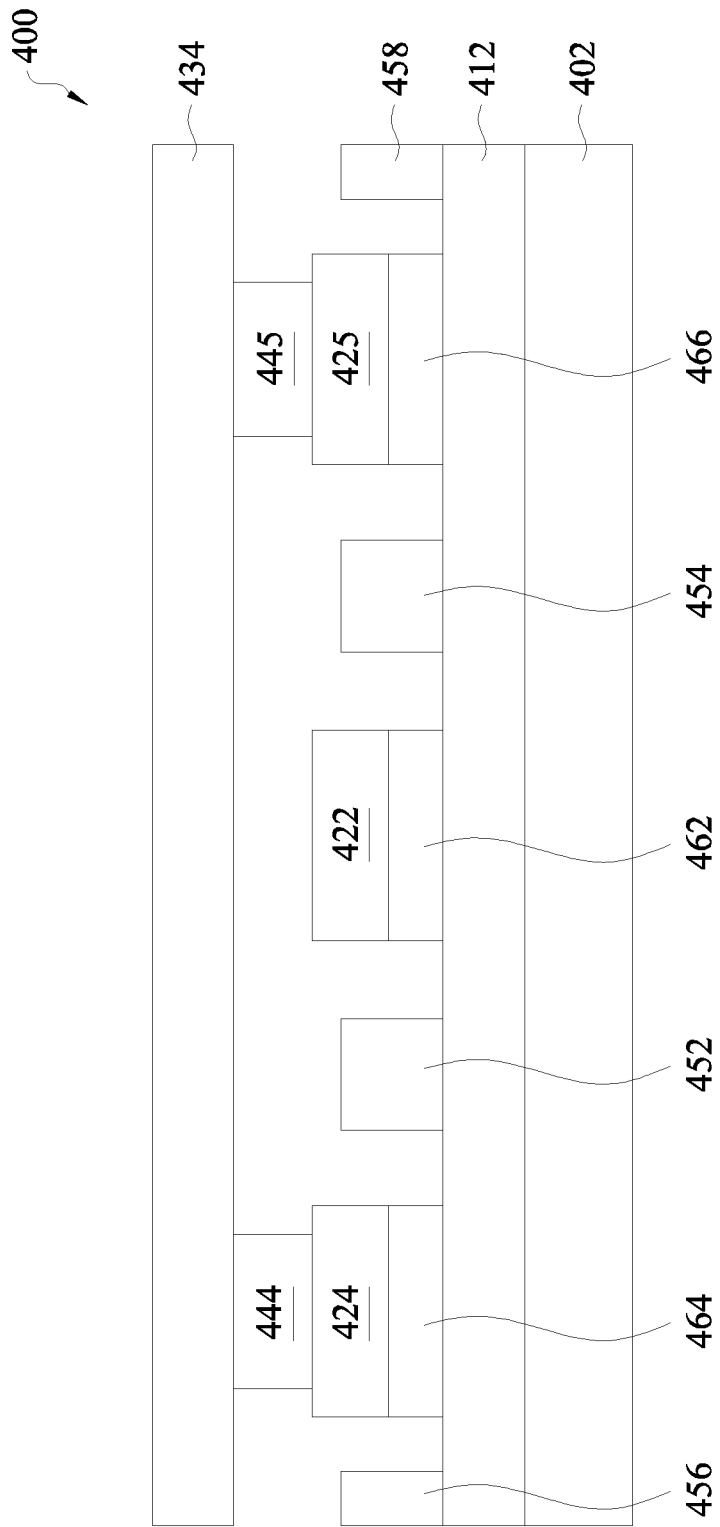
FIGS. 5-8 are cross-sectional views of the memory circuit in FIG. 4 taken along various reference lines in accordance with some embodiments.

Via layout patterns 344 and 345 correspond to via plugs (e.g., 444 and 445 in FIGS. 4 and 5). Via plugs 444 and 445 are at the same via plug layer of the memory circuit as via plug 442. The via plug formed based on via layout pattern 344 is between and electrically connecting the conductive structures formed based on conductive layout pattern 324 and conductive layout pattern 334. The via plug formed based on via layout pattern 345 is between and electrically connecting the conductive structures formed based on conductive layout pattern 325 and conductive layout pattern 334. In some embodiments, none, or one, or both of via layout patterns 344 and 345 are in the layout design 300 depending on the programming states of memory cells 212 and 214.

Via layout patterns 346 and 347 correspond to via plugs (e.g., 446 and 447 in FIG. 4) at the same via plug layer of the memory circuit as via plug 442. The via plug formed based on via layout pattern 346 is between and electrically connecting the conductive structures formed based on conductive layout pattern 326 and conductive layout pattern 336. The via plug formed based on via layout pattern 347 is between and electrically connecting the conductive structures formed based on conductive layout pattern 327 and conductive layout pattern 336. In some embodiments, none, or one, or both of via layout patterns 346 and 347 are in the layout design 300 depending on the programming states of memory cells 216 and 218.

Gate layout pattern 352 extends along the row direction X and overlaps OD layout patterns 312 and 314. Gate layout pattern 352 corresponds to a gate structure of memory cell 212 and a gate structure of memory cell 216. Therefore, a conductive feature formed based on gate layout pattern 352 is associated with gate node 212g of memory cell 212 and gate node 216g of memory cell 216. In some embodiments, gate layout pattern 352 corresponds to forming a word line WL1 in FIG. 2.

Gate layout pattern 354 extends along the row direction X and overlaps OD layout patterns 312 and 314. Gate layout pattern 354 corresponds to a gate structure of memory cell 214 and a gate structure of memory cell 218. Therefore, a conductive feature formed based on gate layout pattern 354 is associated with gate node 214g of memory cell 214 and gate node 218g of memory cell 218. In some embodiments, gate layout pattern 354 corresponds to forming a word line WL1 in FIG. 2.

Gate layout patterns 356 and 356 extend along the row direction X and overlap OD layout patterns 312 and 314. Gate layout patterns 356 and 358 do not corresponds to any gate node of memory cells 212-218. In some embodiments, gate layout patterns 356 and 356 are omitted.

FIG. 4 is a top view of a portion of a memory circuit 400 fabricated based on the layout diagram of FIG. 3 in accordance with some embodiments. In some embodiments, memory circuit 400 corresponds to a portion of memory circuit 100. Also, one or more dielectric layers and/or isolation structures are omitted in FIG. 4 are omitted.

Memory circuit 400 includes a substrate (402 in FIGS. 5-8), active structures 412 and 414 over substrate 402, conductive structures 422, 424, 425, 426, and 427 over active structures 412 and 414, conductive structures 432, 434, and 436 over conductive structures 422-427, via plugs 442, 444, 445, 446, and 447 between a conductive layer corresponding to conductive structures 422-427 and another conductive layer corresponding to conductive structures 432-436, and gate structure 452, 454, 456, and 458 over substrate 402. Memory circuit 400 also includes conductive structures (e.g., conductive structures 462, 464, 466, and 468 in FIGS. 5-7) connecting between a conductive layer corresponding to conductive structures 422-427 and substrate 402. In some embodiments, conductive structures 462, 464, 466, and 468 are at a conductive layer that is referred to as a sub-layer of the M0OD layer. In some embodiments, the conductive layer corresponding to conductive structures 462-468 is called a M0OD1 layer, and the conductive layer corresponding to conductive structures 422-427 is called a M0OD2 layer. In some embodiments, the conductive layer corresponding to conductive structures 432-436 is called a Metal-1 (M1) layer.

Active structures 412 and 414 are formed according to OD layout patterns 312 and 314 in FIG. 3. Conductive structures 422, 424, 425, 426, and 427 are formed according to conductive layout patterns 322-327. Conductive structures 432, 434, and 436 are formed according to conductive layout patterns 332, 334, and 336. Via plugs 442, 444, 445, 446, and 447 are formed according to via plug layout patterns 342-347. Gate structure 452, 454, 456, and 458 are formed according to gate layout patterns 352, 354, 356, and 358. The spatial relationship among various components in FIG. 4 is similar to that of various layout patterns in FIG. 3, and detailed description thereof is thus omitted. Moreover, in some embodiments, none, or some, or all via plugs 442, 444, 445, 446, and 447 are omitted depending on the programming states of their corresponding memory cells.

In some embodiments, memory cells corresponding to gate structure 452, 454, 456, and 458 are N-type transistors. In some embodiments, memory cells corresponding to gate structure 452, 454, 456, and 458 are P-type transistors.

FIGS. 5-8 are cross-sectional views of the memory circuit in FIG. 4 taken along various reference lines in accordance with some embodiments. The components in FIGS. 5-8 that are the same or similar to those in FIG. 4 are given the same reference numbers, and detailed description thereof is thus omitted. Also, one or more dielectric layers and/or isolation structures are omitted in FIGS. 5-8 are omitted.

FIG. 5 is a cross-sectional view of the memory circuit 400 taken along a reference line AA' in accordance with some embodiments. Gate structure 452 corresponds to a gate node of a memory cell, such as memory cell 212 in FIG. 2. Gate structure 454 corresponds to a gate node of another memory cell, such as memory cell 214. Conductive structures 422 and 462 are electrically coupled with a shared source portion of active structure 412, and the shared source portion corresponds to source nodes 212s and 214s of memory cells 212 and 214. Conductive structures 424 and 464 are electrically coupled with a drain portion of active structure 412 corresponding to the drain node 212d of memory cell 212. Conductive structures 424 and 464 are electrically coupled with a drain portion of active structure 412 corresponding to the drain node 212d of memory cell 212. Via plugs 444 and 445 electrically coupling the conductive features 424 and 425 with conductive feature 434. In some embodiments, none, or one, or both of via plugs 444 and 445 are omitted depending on the programming states of the corresponding memory cells.

Figure 7:
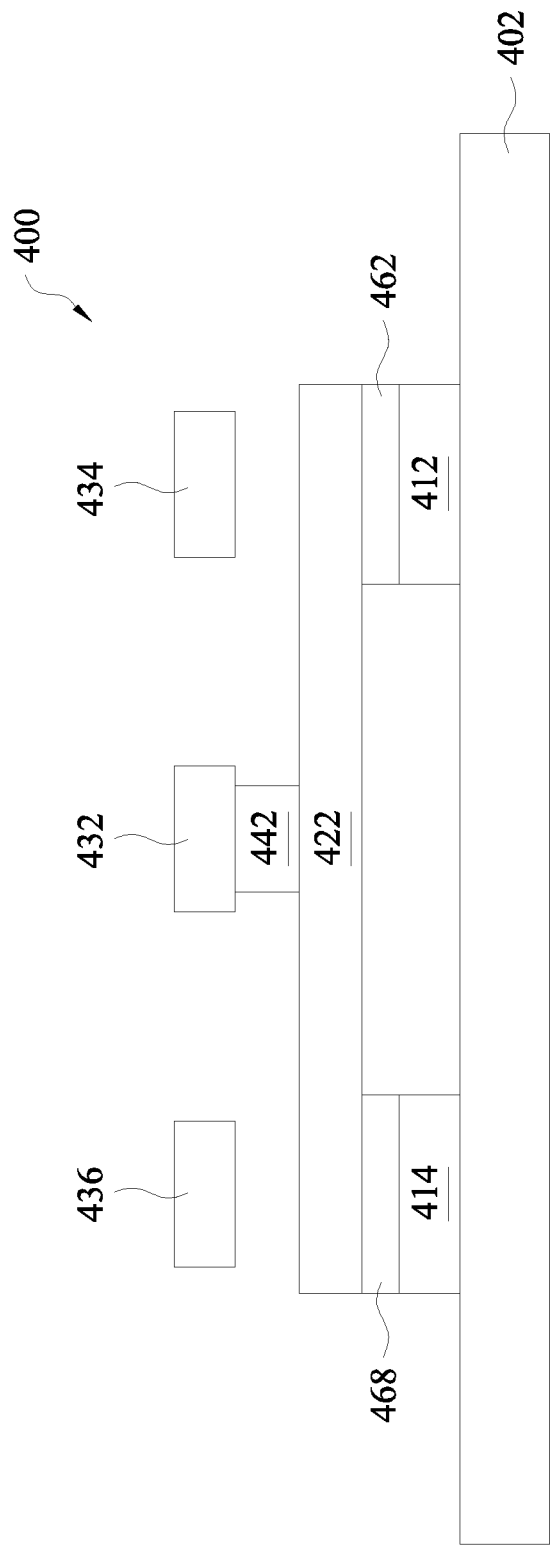

FIG. 6 is a cross-sectional view of the memory circuit 400 taken along a reference line BB' in accordance with some embodiments. FIG. 7 is a cross-sectional view of the memory circuit 400 taken along a reference line CC' in accordance with some embodiments. Conductive structures 422 and 468 are electrically coupled with a shared source portion of active structure 414, and the shared source portion corresponds to source nodes 216s and 218s of memory cells 216 and 218. As depicted in FIGS. 6 and 7, conductive structure 422 extends to cover the shared source portions of active structures 412 and 414. Via plug 442 electrically couples conductive structure 422 with conductive structure 434.

Figure 8:
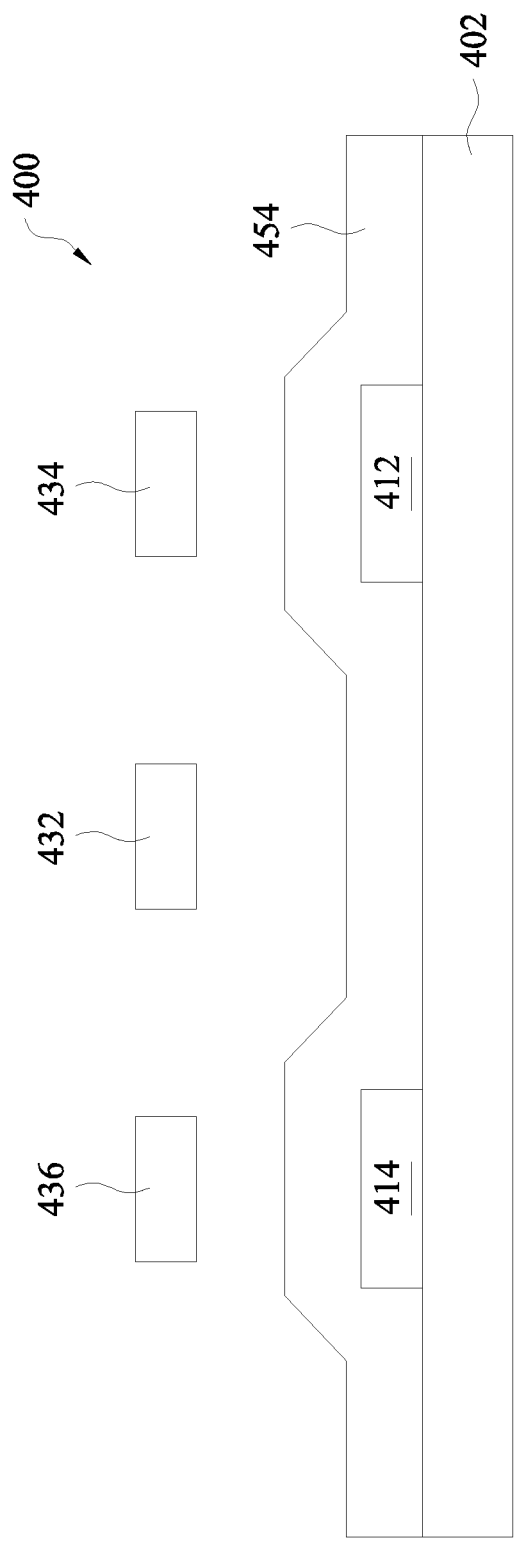

FIG. 8 is a cross-sectional view of the memory circuit 400 taken along a reference line DD' in accordance with some embodiments. Gate structure 454 extends to cover portions of active structures 412 and 414. Gate structure 454 is electrically isolated from conductive features 432, 434, and 436.

Figure 9:
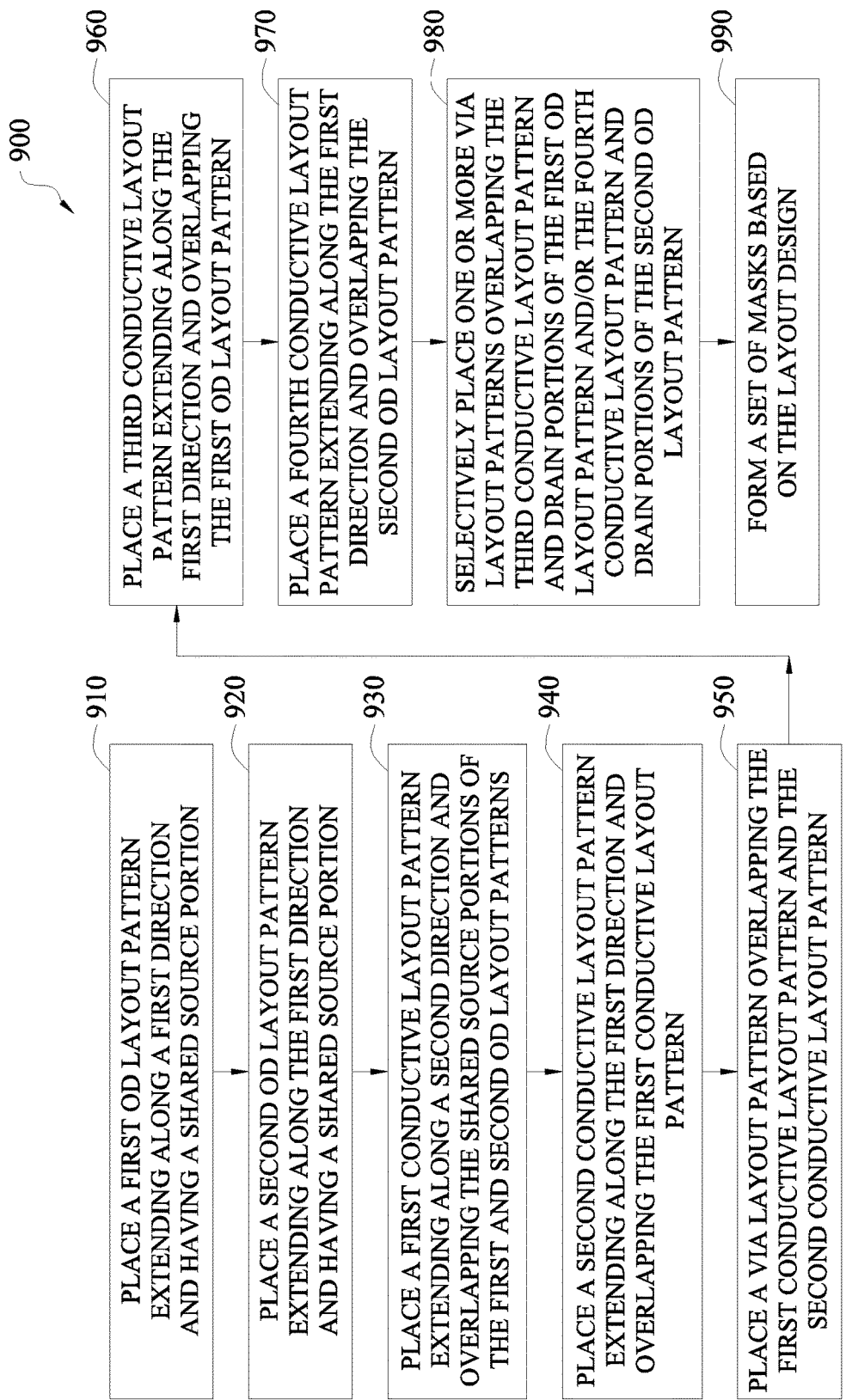
FIG. 9 is a flow chart of a method of forming a layout design of a memory circuit in accordance with some embodiments.

FIG. 9 is a flow chart of a method 900 of forming a layout design of a memory circuit in accordance with some embodiments. A set of masks for fabricating the memory circuit is formed based on the layout design. FIG. 9 will be illustrated in conjunction with the examples depicted in FIG. 3. It is understood that additional operations may be performed before, during, and/or after the method 900 depicted in FIG. 9, and that some other processes may only be briefly described herein. Moreover, the method 900 is wholly or partially performed by using a hardware processor, such as processor 1012 in FIG. 10.

The method 900 begins with operation 910, where a first OD layout pattern (e.g., layout pattern 312) is placed in the layout design. The layout design is generated based on a circuit design, such as the circuit schematic diagram in FIG. 2. The first OD layout pattern 312 extends along a column direction Y and has a shared source portion 312a. The shared source portion 312a is associated with a source node of memory cell 212 and a source node of memory cell 214.

The method 900 proceeds to operation 920, where a second OD layout pattern (e.g., layout pattern 314) is placed in the layout design. The second OD layout pattern 314 extends along the column direction Y and has a shared source portion 314a. The shared source portion 314a is associated with a source node of memory cell 216 and a source node of memory cell 218.

The method 900 proceeds to operation 930, where a first conductive layout pattern (e.g., layout pattern 322) is placed in the layout design. The conductive structure (e.g., conductive structure 422) corresponding to layout pattern 322 is under a lowest via plug layer of the memory circuit. The first conductive layout pattern 322 extends along a row direction X and overlaps the shared source portions 312a and 314a. Therefore, layout pattern 322 is associated with the source nodes of memory cells 212, 214, 216, and 218.

The method 900 proceeds to operation 940, where a second conductive layout pattern (e.g., layout pattern 332) is placed in the layout design. The conductive structure (e.g., conductive structure 432) corresponding to layout pattern 332 is over the lowest via plug layer of the memory circuit. The second conductive layout pattern 332 extends along the column direction Y and overlaps the first conductive layout pattern 322. In some embodiments, the second conductive layout pattern 332 overlaps memory cell region 302, 304, 306, and 308.

The method 900 proceeds to operation 950, where a via layout pattern (e.g., layout pattern 342) of the lowest via plug layer is placed in the layout design. The via layout pattern 342 overlaps layout patterns 322 and 332. The via plug (e.g., via plug 442) corresponding to layout pattern 342 electrically connecting the conductive structures formed according to layout patterns 322 and 332. Therefore, the layout pattern 332 and via layout pattern 342 are also associated with the source nodes of memory cells 212, 214, 216, and 218.

The method 900 proceeds to operation 960, where a third conductive layout pattern (e.g., layout pattern 334) is placed in the layout design. The conductive structure (e.g., conductive structure 434) corresponding to layout pattern 334 is over the OD layout pattern 312. The third conductive layout pattern 334 extends along the column direction Y and overlaps the drain portions 312b and 312c of the OD layout pattern 312. In some embodiments, the third conductive layout pattern 334 overlaps memory cell region 302 and 304.

The method 900 proceeds to operation 970, where a fourth conductive layout pattern (e.g., layout pattern 336) is placed in the layout design. The conductive structure (e.g., conductive structure 436) corresponding to layout pattern 336 is over the OD layout pattern 314. The fourth conductive layout pattern 336 extends along the column direction Y and overlaps the drain portions 314b and 314c of the OD layout pattern 314. In some embodiments, the fourth conductive layout pattern 336 overlaps memory cell region 306 and 308.

The method 900 proceeds to operation 980, where one or more via layout patterns (e.g., layout patterns 344, 345, 346, and 347) are selectively placed in the layout design. Each of the via layout patterns 344, 345, 346, and 347 corresponds to a via plug 444, 445, 446, and 447 configured to electrically coupling the conductive structure associated with layout pattern 334 or 336 with a corresponding drain portion 312b, 312c, 314b, or 314c. Selectively placing one or more of layout patterns 344, 345, 346, and 347 are placed in the layout design is performed based on the programming states of memory cells 212, 214, 216, and 218. In some embodiments, all layout patterns 344, 345, 346, and 347, and operation 980 is omitted.

The method 900 proceeds to operation 990, where a set of masks for fabricating the corresponding memory circuit is formed based on the layout design.

Figure 10:
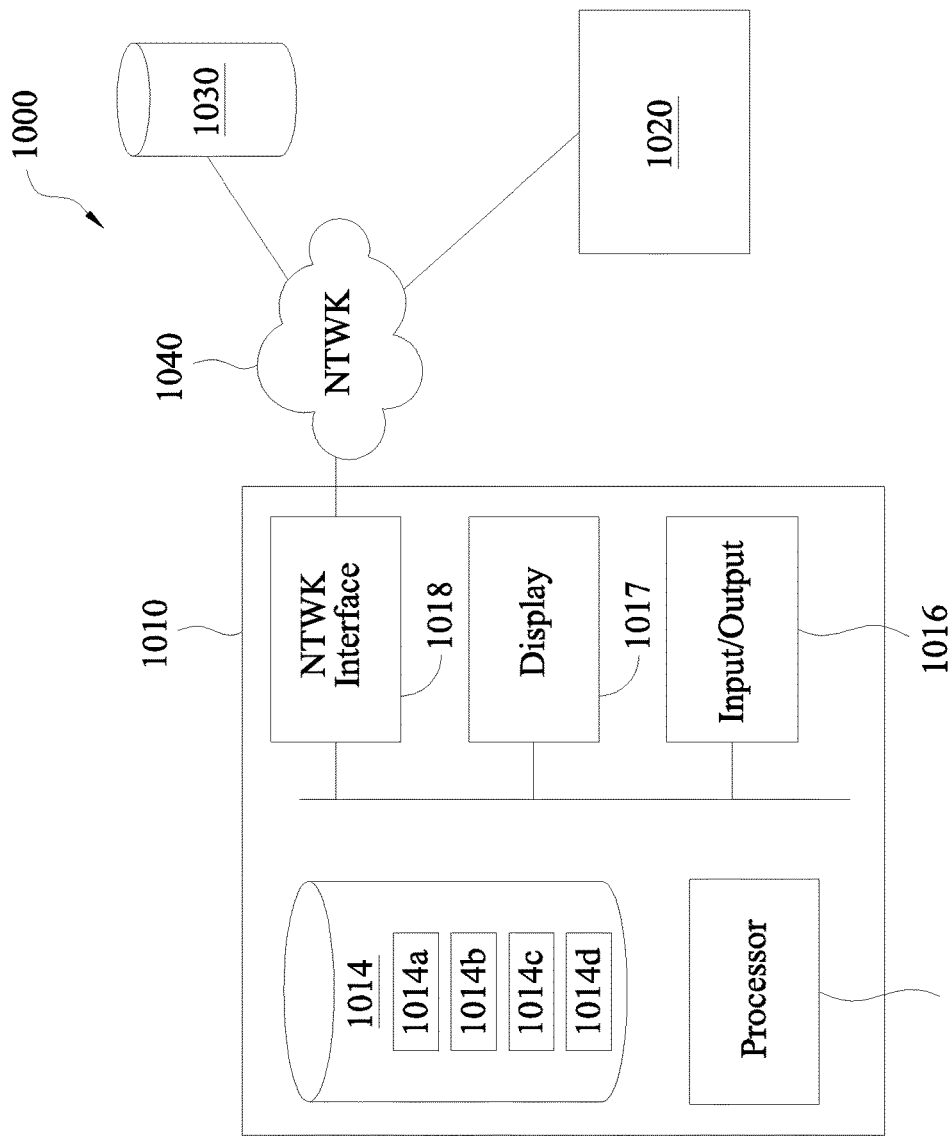
FIG. 10 is a functional block diagram of a layout system in accordance with one or more embodiments.

FIG. 10 is a functional block diagram of a layout system 1000 in accordance with one or more embodiments. Layout system 1000 includes a first computer system 1010, a second computer system 1020, a networked storage device 1030, and a network 1040 connecting the first computer system 1010, the second computer system 1020, and the networked storage device 1030. In some embodiments, one or more of the second computer system 1020, the storage device 1030, and the network 1040 are omitted.

First computer system 1010 includes a hardware processor 1012 communicatively coupled with a non-transitory, computer readable storage medium 1014 encoded with, i.e., storing, a set of instructions 1014a, a circuit design 1014b, a layout design 1014c, or any intermediate data 1014d for executing the set of instructions 1014a. The processor 1012 is electrically and communicatively coupled with the computer readable storage medium 1014. The processor 1012 is configured to execute the set of instructions 1014a encoded in the computer readable storage medium 1014 in order to cause the computer 1010 to be usable as a layout tool for performing a method as described in conjunction with FIG. 9.

In some embodiments, the set of instructions 1014a, the circuit design 1014b, the layout design 1014c, or the intermediate data 1014d are stored in a non-transitory storage medium other than storage medium 1014. In some embodiments, some or all of the set of instructions 1014a, the circuit design 1014b, the layout design 1014c, or the intermediate data 1014d are stored in a non-transitory storage medium in networked storage device 1030 or second computer system 1020. In such case, some or all of the set of instructions 1014a, the circuit design 1014b, the layout design 1014c, or the intermediate data 1014d stored outside computer 1010 is accessible by the processor 1012 through the network 1040.

In some embodiments, the processor 1012 is a central processing unit (CPU), a multi-processor, a distributed processing system, an application specific integrated circuit (ASIC), and/or a suitable processing unit.

In some embodiments, the computer readable storage medium 1014 is an electronic, magnetic, optical, electromagnetic, infrared, and/or a semiconductor system (or apparatus or device). For example, the computer readable storage medium 1014 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 1014 includes a compact disk-read only memory (CD-ROM), a compact disk-read/write (CD-R/W), and/or a digital video disc (DVD).

The computer system 1010 includes, in at least some embodiments, an input/output interface 1016 and a display unit 1017. The input/output interface 1016 is coupled to the processor 1012 and allows the layout engineer to manipulate the first computer system 1010. In at least some embodiments, the display unit 1017 displays the status of executing the set of instructions 1014a and, in at least some embodiments, provides a Graphical User Interface (GUI). In at least some embodiments, the display unit 1017 displays the status of executing the set of instructions 1014a in a real time manner. In at least some embodiments, the input/output interface 1016 and the display 1017 allow an operator to operate the computer system 1010 in an interactive manner.

In at least some embodiments, the computer system 1000 also includes a network interface 1018 coupled to the processor 1012. The network interface 1018 allows the computer system 1010 to communicate with the network 1040, to which one or more other computer systems are connected. The network interface includes wireless network interfaces such as BLUETOOTH, WIFI, WIMAX, GPRS, or WCDMA; or wired network interface such as ETHERNET, USB, or IEEE-1394.

In accordance with one embodiment, a layout design for fabricating a memory circuit is disclosed. The layout design includes a first memory cell region corresponding to a first memory cell of the memory circuit, a second memory cell region corresponding to a second memory cell of the memory circuit, a third memory cell region corresponding to a third memory cell of the memory circuit, a fourth memory cell region corresponding to a fourth memory cell of the memory circuit, a first oxide diffusion (OD) layout pattern corresponding to a first active structure for forming the first memory cell and the second memory cell, a second OD layout pattern corresponding to a second active structure for forming the third memory cell and the fourth memory cell, and a first conductive layout pattern corresponding to a first conductive structure. The first, second, third, and fourth memory cell regions abut one another other. The first OD layout pattern extends along a first direction and has a shared source portion overlapping the first memory cell region and the second memory cell region. The second OD layout pattern extends along the first direction and has a shared source portion overlapping the third memory cell region and the fourth memory cell region. The first conductive structure is under a lowest via plug layer of the memory circuit. The first conductive layout pattern extends along a second direction and overlaps the shared source portion of the first OD layout pattern and the shared source portion of the second OD layout pattern.

In accordance with another embodiment, a method of forming a layout design corresponding to a first memory cell, a second memory cell, a third memory cell, and a fourth memory cell of a memory circuit is disclosed. The method includes placing a first oxide diffusion (OD) layout pattern in the layout design; placing a second oxide diffusion (OD) layout pattern in the layout design, and placing a first conductive layout pattern corresponding to a first conductive structure. The first OD layout pattern extends along a first direction and has a shared source portion. The shared source portion of the first OD layout pattern is associated with a source node of the first memory cell and a source node of the second memory cell. The second OD layout pattern extends along the first direction and has a shared source portion. The shared source portion of the second OD layout pattern is associated with a source node of the third memory cell and a source node of the fourth memory cell. The first conductive structure is under a lowest via plug layer of the memory circuit. The first conductive layout pattern extends along a second direction and overlaps the shared source portion of the first OD layout pattern and the shared source portion of the second OD layout pattern. The first conductive layout pattern is associated with the source node of the first memory cell, the source node of the second memory cell, the source node of the third memory cell, and the source node of the fourth memory cell. The method is wholly or partially performed by using a hardware processor.

In accordance with another embodiment, a memory circuit includes a first active structure extending along a first direction, a second active structure extending along the first direction, a first conductive structure extending along a second direction, and a lowest via plug layer over the first conductive structure. The first active structure has a shared source portion corresponding to a source node of a first memory cell of the memory circuit and a source node of a second memory cell of the memory circuit. The second active structure has a shared source portion corresponding to a source node of a third memory cell of the memory circuit and a source node of a fourth memory cell of the memory circuit. The first conductive structure electrically connects the shared source portion of the first active structure with the shared source portion of the second active structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit, comprising:
a first active structure extending along a first direction, the first active structure having a shared source portion corresponding to a source node of a first memory cell of the memory circuit and a source node of a second memory cell of the memory circuit;
a second active structure extending along the first direction, the second active structure having a shared source portion corresponding to a source node of a third memory cell of the memory circuit and a source node of a fourth memory cell of the memory circuit;
a first conductive structure extending along a second direction and electrically connecting the shared source portion of the first active structure with the shared source portion of the second active structure, wherein the first conductive structure is over the first active structure; and
a lowest via plug layer over the first conductive structure, wherein the lowest via plug layer provides an electrical connection between the first conductive structure and a metal layer farther from the first active structure than the first conductive structure.

2. The memory circuit of claim 1, further comprising:
a second conductive structure extending along the first direction and between the first active structure and the second active structure; and
a via plug of the lowest via plug layer, the via plug being between and electrically connecting the first conductive structure and the second conductive structure.

3. The memory circuit of claim 1, further comprising:
a second conductive structure over the first conductive structure, the second conductive structure extending along the first direction and overlapping the first active structure; and
one or both of the following:
a first via plug of the lowest via plug layer, the first via plug electrically connecting the second conductive structure and a first drain portion of the first active structure, the first drain portion of the first active structure corresponding to a drain node of the first memory cell; and
a second via plug of the lowest via plug layer, the second via plug electrically connecting the second conductive structure and a second drain portion of the first active structure, the second drain portion of the first active structure corresponding to a drain node of the second memory cell.

4. The memory circuit of claim 1, further comprising:
a second conductive structure over the first conductive structure, the second conductive structure extending along the first direction and overlapping the second active structure; and
one or both of the following:
a first via plug of the lowest via plug layer, the first via plug electrically connecting the second conductive structure and a first drain portion of the second active structure, the first drain portion of the second active structure corresponding to a drain node of the third memory cell; and
a second via plug of the lowest via plug layer, the second via plug electrically connecting the second conductive structure and a second drain portion of the second active structure, the second drain portion of the second active structure corresponding to a drain node of the fourth memory cell.

5. The memory circuit of claim 1, further comprising:
a first gate structure extending along the second direction, the first gate structure corresponding to a gate node of the first memory cell and a gate node of the third memory cell; and
a second gate structure extending along the second direction, the second gate structure corresponding to a gate node of the second memory cell and a gate node of the fourth memory cell.

6. A memory circuit, comprising:
a first active structure extending along a first direction, the first active structure having a first shared source portion of a first memory cell and a second memory cell;
a second active structure extending along the first direction, the second active structure having a second shared source portion of a third memory cell and a fourth memory cell; and
a first conductive structure being under a lowest via plug layer of the memory circuit, the first conductive structure extending along a second direction and overlapping the first shared source portion and the second shared source portion, wherein the first conductive structure is over the first active structure and the first conductive structure is electrically connected between the lowest via plug layer and the first active structure.

7. The memory circuit of claim 6, further comprising:
a second conductive structure being over the first conductive structure and extending along the first direction; and
a via plug of the lowest via plug layer, the via plug being between and electrically connecting the first conductive structure and the second conductive structure.

8. The memory circuit of claim 7, wherein the second conductive structure overlaps a portion of the first memory cell, the second memory cell, the third memory cell, and the fourth memory cell.

9. The memory circuit of claim 6, wherein the first conductive structure overlaps a portion of the first memory cell, the second memory cell, the third memory cell, and the fourth memory cell.

10. The memory circuit of claim 6, further comprising:
a second conductive structure extending along the first direction and overlapping the first active structure, the second conductive structure being over the first conductive structure; and
a via plug of the lowest via plug layer, the via plug electrically connecting the second conductive structure and the first active structure, the via plug overlapping the second conductive structure and a first drain portion of the first memory cell.

11. The memory circuit of claim 6, further comprising:
a second conductive structure extending along the first direction and overlapping the first active structure, the second conductive structure being over the first conductive structure; and
a via plug of the lowest via plug layer, the via plug electrically connecting the second conductive structure and the first active structure, the via plug overlapping the second conductive structure and a second drain portion of the second memory cell.

12. The memory circuit of claim 6, further comprising:
a second conductive structure extending along the first direction and overlapping the second active structure, the second conductive structure being over the first conductive structure; and a via plug of the lowest via plug layer, the via plug electrically connecting the second conductive structure and the second active structure, the via plug overlapping the second conductive structure and a third drain portion of the third memory cell.

13. The memory circuit of claim 6, further comprising:
a second conductive structure extending along the first direction and overlapping the second active structure, the second conductive structure being over the first conductive structure; and
a via plug of the lowest via plug layer, the via plug electrically connecting the second conductive structure and the second active structure, the via plug overlapping the second conductive structure and a fourth drain portion of the fourth memory cell.

14. The memory circuit of claim 6, further comprising:
a first word line having a first gate structure, the first gate structure overlapping the first active structure and the second active structure, the first gate structure extending along the second direction, and the first gate structure corresponding to a gate node of the first memory cell and a gate node of the third memory cell.

15. The memory circuit of claim 14, further comprising:
a second word line having a second gate structure, the second gate structure overlapping the first active structure and the second active structure, the second gate structure extending along the second direction, and the second gate structure corresponding to a gate node of the second memory cell and a gate node of the fourth memory cell.

16. A memory circuit, comprising:
a first active structure extending along a first direction, the first active structure having a first source portion shared by a first memory cell and a second memory cell;
a second active structure being parallel to the first active structure, the second active structure having a second source portion shared by a third memory cell and a fourth memory cell;
a first conductive structure extending along a second direction and overlapping the first source portion and the second source portion, wherein the first conductive structure is over the first active structure;
a first via plug over the first conductive structure, wherein the first via plug is electrically connected between the first conductive structure and a metal layer farther from the first active structure than the first conductive structure; and
a second conductive structure between the first active structure and the second active structure, the second conductive structure electrically connected to the first active structure by the first via plug.

17. The memory circuit of claim 16, wherein the first conductive structure or the second conductive structure overlaps a portion of the first memory cell, the second memory cell, the third memory cell, and the fourth memory cell.

18. The memory circuit of claim 16, further comprising:
a third conductive structure over the first conductive structure, the third conductive structure extending along the first direction and overlapping the first active structure, and the third conductive structure being on a same layer as the second conductive structure; and
one or both of the following:
a second via plug being electrically connected to the second conductive structure and a first drain portion of the first active structure, the first drain portion of the first active structure corresponding to a drain node of the first memory cell; and
a third via plug being electrically connected to the second conductive structure and a second drain portion of the first active structure, the second drain portion of the first active structure corresponding to a drain node of the second memory cell.

19. The memory circuit of claim 16, further comprising:
a third conductive structure over the first conductive structure, the third conductive structure extending along the first direction and overlapping the second active structure, and the third conductive structure being on a same layer as the second conductive structure; and
one or both of the following:
a second via plug being electrically connected to the second conductive structure and a first drain portion of the second active structure, the first drain portion of the second active structure corresponding to a drain node of the third memory cell; and
a third via plug being electrically connected to the second conductive structure and a second drain portion of the second active structure, the second drain portion of the second active structure corresponding to a drain node of the fourth memory cell.

20. The memory circuit of claim 16, further comprising:
a first word line having a first gate structure, the first gate structure overlapping the first active structure and the second active structure, the first gate structure extending along the second direction, and the first gate structure corresponding to a gate node of the first memory cell and a gate node of the third memory cell; and
a second word line having a second gate structure, the second gate structure overlapping the first active structure and the second active structure, the second gate structure extending along the second direction, and the second gate structure corresponding to a gate node of the second memory cell and a gate node of the fourth memory cell.

* * * * *